(12) United States Patent
Khlat

(10) Patent No.: US 11,108,360 B2
(45) Date of Patent: Aug. 31, 2021

(54) DOHERTY POWER AMPLIFIER SYSTEM

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 42 days.

(21) Appl. No.: 16/516,766

(22) Filed: Jul. 19, 2019

(65) Prior Publication Data
US 2020/0028471 A1 Jan. 23, 2020

Related U.S. Application Data

(60) Provisional application No. 62/701,217, filed on Jul. 20, 2018.

(51) Int. Cl.
| | |
|---|---|
| *H03F 3/60* | (2006.01) |
| *H03F 1/02* | (2006.01) |
| *H03F 3/19* | (2006.01) |
| *H03F 3/20* | (2006.01) |
| *H03F 3/21* | (2006.01) |

(52) U.S. Cl.
CPC ............ *H03F 1/0288* (2013.01); *H03F 3/19* (2013.01); *H03F 3/20* (2013.01); *H03F 3/211* (2013.01); *H03F 3/602* (2013.01)

(58) Field of Classification Search
CPC . H03F 1/0288; H03F 3/19; H03F 3/20; H03F 1/565; H03F 3/195; H03F 3/245; H03F 2200/451; H03F 3/602; H03F 3/211; H03F 3/607; H03F 3/60; H03F 3/604; H01L 23/66; H01L 2223/6655; H01L 2223/6611

USPC .................... 330/124 R, 286, 295
See application file for complete search history.

(56) References Cited

U.S. PATENT DOCUMENTS

| | | | | |
|---|---|---|---|---|
| 6,356,149 B1 * | 3/2002 | Stengel | ............... | H03F 1/0288 330/107 |
| 7,345,535 B2 * | 3/2008 | Kwon | ................. | H03F 1/0205 330/124 R |
| 7,427,895 B1 * | 9/2008 | Okubo | ................... | H03F 3/602 330/124 R |

(Continued)

OTHER PUBLICATIONS

Non-Final Office Action for U.S. Appl. No. 16/516,774, dated Oct. 5, 2020, 10 pages.

(Continued)

*Primary Examiner* — Khanh V Nguyen
(74) *Attorney, Agent, or Firm* — Withrow & Terranova, PLLC

(57) ABSTRACT

A Doherty amplifier system is disclosed. The Doherty amplifier system includes a carrier amplifier having a main input for receiving a first portion of a radio frequency (RF) signal and a main output in communication with a RF signal output. A peaking amplifier has a peak input for receiving a second portion of the RF signal and a peak output in communication with the RF signal output. Further included is a first impedance inverter coupled between the main output and the peak output. A second impedance inverter is coupled between the peak output and the RF signal output. A first impedance inverter coefficient of the first impedance inverter is numerically within ±10% of a second impedance inverter coefficient of the second impedance inverter.

19 Claims, 6 Drawing Sheets

(56) References Cited

U.S. PATENT DOCUMENTS

| | | | |
|---|---|---|---|
| 7,786,797 B2* | 8/2010 | Okazaki | H03F 1/0288 |
| | | | 330/124 R |
| 8,115,546 B2* | 2/2012 | Hong | H03F 1/0288 |
| | | | 330/124 R |
| 8,279,009 B2 | 10/2012 | Grondahl et al. | |
| 9,774,299 B2* | 9/2017 | Staudinger | H03F 1/0288 |
| 9,979,352 B2 | 5/2018 | Hur et al. | |
| 2009/0206927 A1* | 8/2009 | Okubo | H03F 1/0288 |
| | | | 330/124 R |
| 2010/0001802 A1 | 1/2010 | Blednov | |
| 2014/0132343 A1* | 5/2014 | Colantonio | H03F 3/24 |
| | | | 330/124 R |
| 2015/0119107 A1* | 4/2015 | Bouny | H04W 88/08 |
| | | | 455/561 |
| 2015/0180428 A1* | 6/2015 | Pham | H03F 1/48 |
| | | | 330/295 |
| 2015/0229276 A1* | 8/2015 | Shiikuma | H03F 1/565 |
| | | | 330/124 R |
| 2021/0075374 A1 | 3/2021 | Wang et al. | |

OTHER PUBLICATIONS

Notice of Allowance for U.S. Appl. No. 16/516,774, dated Feb. 4, 2021, 7 pages.
Non-Final Office Action for U.S. Appl. No. 16/710,461, dated Mar. 31, 2021, 8 pages.
Non-Final Office Action for U.S. Appl. No. 16/710,461, dated Apr. 27, 2021, 9 pages.

\* cited by examiner

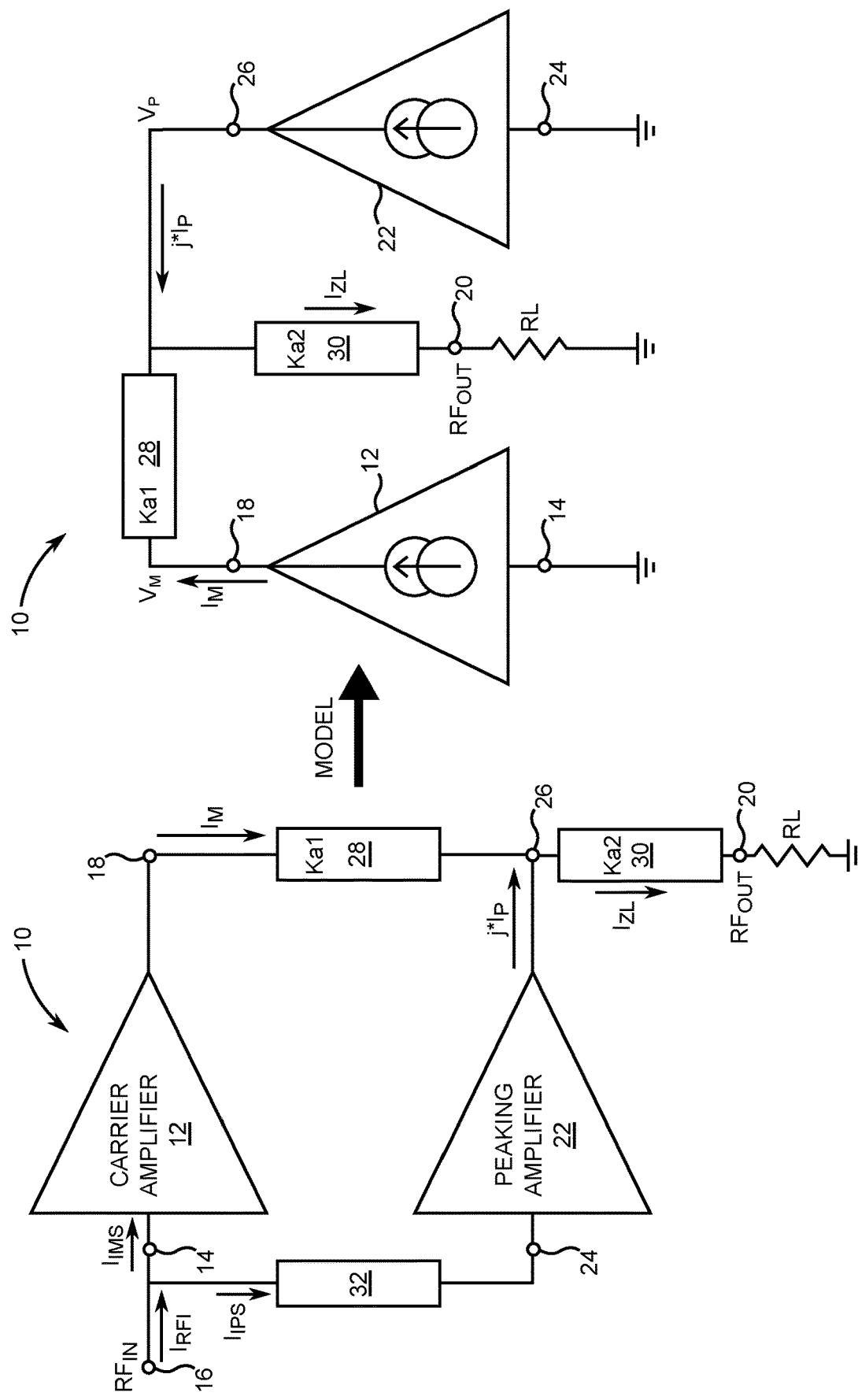

DOHERTY POWER AMPLIFIER SYSTEM

RELATED APPLICATIONS

This application claims the benefit of provisional patent application Ser. No. 62/701,217, filed Jul. 20, 2018, the disclosure of which is hereby incorporated herein by reference in its entirety.

This application is related to U.S. patent application Ser. No. 16/516,774, filed Jul. 19, 2019, and titled DOHERTY AMPLIFIER SYSTEM, now U.S. Patent Application Publication No. 2020/0028472 A1, which claims the benefit of provisional patent application Ser. No. 62/701,217, filed Jul. 20, 2018, the disclosures of which are hereby incorporated herein by reference in their entireties.

FIELD OF DISCLOSURE

The present disclosure relates to radio frequency amplifier circuitry and in particular to Doherty radio frequency amplifier circuitry with improved performance.

BACKGROUND

Radio frequency (RF) power amplifiers are used to increase the amplitude of RF signals for transmission. One popular type of RF power amplifier is the Doherty amplifier because of its relatively greater efficiency in comparison with many other RF power amplifier types. The Doherty amplifier includes a carrier amplifier and a peaking amplifier. Generally, at output power levels below an average output power level, only the carrier amplifier is active to amplify an RF signal. The peaking amplifier becomes active at an output power level close to around the average power level. As output power increases from activation of the peaking amplifier, the peaking amplifier operates in parallel with the carrier amplifier to amplify the RF signal.

While the relatively greater efficiency of the Doherty amplifier is very attractive, traditional Doherty amplifiers have a relatively limited modulation bandwidth in comparison to the 400 MHz modulation bandwidth Fifth-generation New Radio (5G-NR) applications. What is needed is a new Doherty amplifier that can meet the 400 MHz modulation requirement of 5G-NR.

SUMMARY

A Doherty amplifier system is disclosed. The Doherty amplifier system includes a carrier amplifier having a main input for receiving a first portion of a radio frequency (RF) signal and a main output in communication with a RF signal output. A peaking amplifier has a peak input for receiving a second portion of the RF signal and a peak output in communication with the RF signal output. Further included is a first impedance inverter coupled between the main output and the peak output. A second impedance inverter is coupled between the peak output and the RF signal output. A first impedance inverter coefficient of the first impedance inverter is numerically within ±10% of a second impedance inverter coefficient of the second impedance inverter.

In some exemplary embodiments, the first impedance inverter coefficient of the first impedance inverter is numerically within ±5% of the second impedance inverter coefficient of the second impedance inverter. In some other exemplary embodiments, the first impedance inverter coefficient of the first impedance inverter is numerically within ±1% of the second impedance inverter coefficient of the second impedance inverter.

In exemplary embodiments, the Doherty amplifier system further includes a controller with an output coupled to a control input of the peaking amplifier and is configured to maintain a peak current flowing from the peak output in proportion with a main current flowing from the main output when the peaking amplifier is active.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 1 is a simplified schematic of a Doherty amplifier that is in accordance with the present disclosure.

FIG. 2 is a model of a Doherty amplifier of FIG. 1.

DETAILED DESCRIPTION

Figure 3:
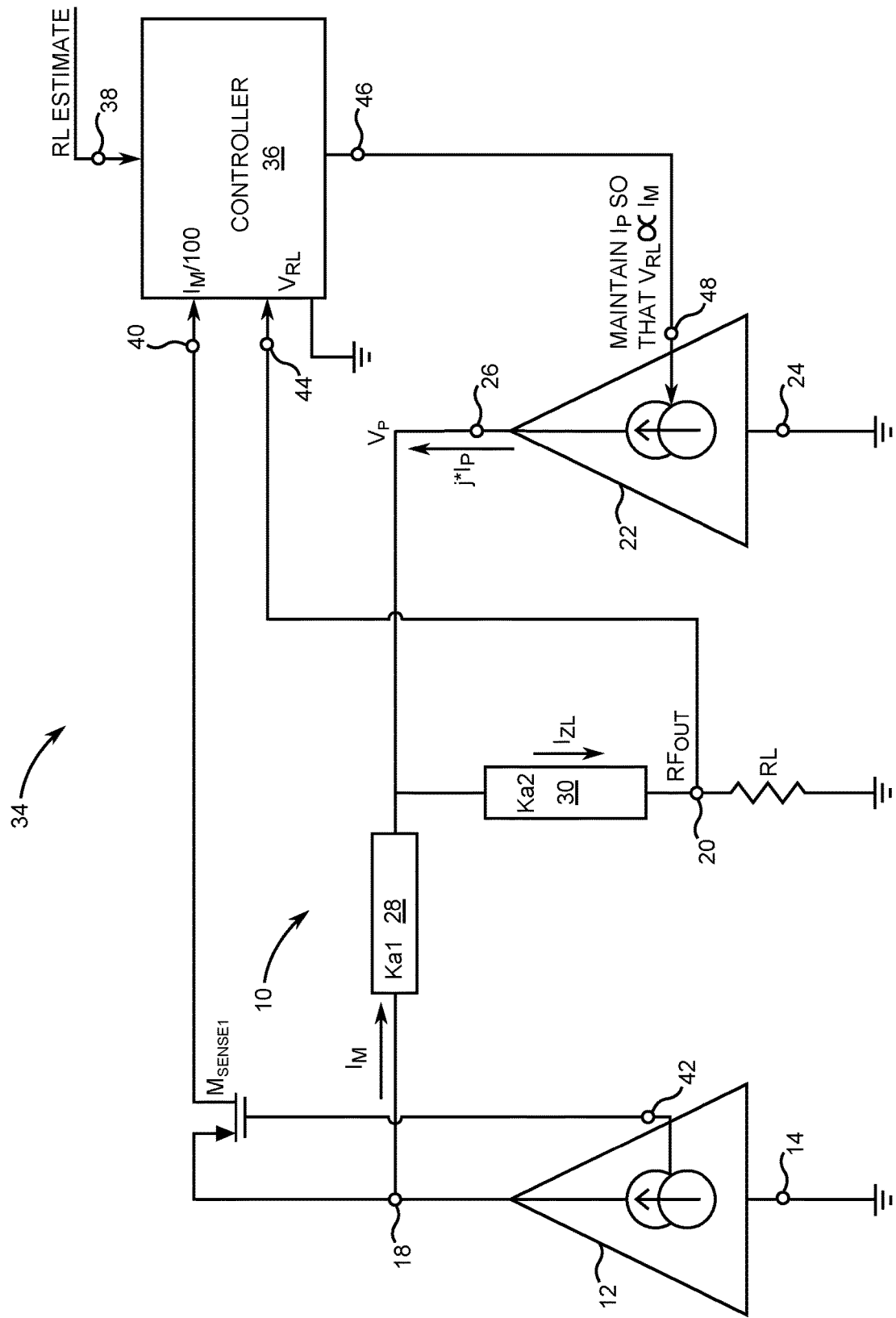
FIG. 3 is a schematic depicting a first embodiment of a Doherty amplifier system that includes a controller configured to control the Doherty amplifier of FIG. 1.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a simplified schematic of a Doherty amplifier 10 that is in accordance with the present disclosure. The Doherty amplifier 10 includes a carrier amplifier 12 having a main input 14 in communication with a radio frequency (RF) signal input 16 and a main output 18 in communication with a RF signal output 20. A peaking amplifier 22 has a peak input 24 in communication with the RF signal input 16 and a peak output 26 in communication with the RF signal output 20. Further included is a first impedance inverter 28 coupled between the main output 18 and the peak output 26. A second impedance inverter 30 is coupled between the peak output 26 and the RF signal output 20. A load RL is coupled between the RF signal output 20 and a fixed voltage node such as ground.

The first impedance inverter 28 has a first impedance inverter coefficient Ka1, and the second impedance inverter 30 has a second impedance inverter coefficient Ka2. In some literatures, an impedance inverter coefficient Ka, such as the first impedance inverter coefficient Ka1 and the second impedance inverter coefficient Ka2, is also referred to as an impedance inverter constant Ka. In a basic form, an impedance inverter such as the first impedance inverter 28 and the second impedance inverter 30 can be realized using a quarter-wave transformer, wherein Ka equals a value of a characteristic impedance Z0 that provides impedance inversion between an input and an output of the impedance inverter. Ideally, in accordance with the present disclosure, the first impedance inverter coefficient Ka1 and the second impedance inverter coefficient Ka2 are numerically equal such that Ka1/Ka2 is unity. However, due to tolerances of manufacture, the first impedance inverter coefficient Ka1 and the second impedance coefficient Ka2 are not exactly equal. Therefore, some acceptable ranges of near equality have been determined for embodiments of the present disclosure.

In this regard and in at least some embodiments, the first impedance inverter coefficient Ka1 is numerically within ±10% of the second impedance inverter coefficient Ka2. In at least some other embodiments, the first impedance inverter coefficient Ka1 is numerically within ±5% of the second impedance coefficient Ka2. In yet some other embodiments, the first impedance inverter coefficient Ka1 is numerically within ±1% of the second impedance inverter coefficient Ka2.

In FIG. 1 an input coupler 32 is in communication with the RF signal input 16, the main input 14, and the peak input 24. The input coupler 32 is configured to receive an RF signal $I_{RFI}$ at the RF signal input 16 and provide a first portion $I_{IMS}$ of the RF signal $I_{RFI}$ to the carrier amplifier 12 through the main input 14. The input coupler 32 provides a second portion $I_{IPS}$ of the RF signal $I_{RFI}$ to the peaking amplifier 22 through the peak input 24. The carrier amplifier 12 outputs a main current $I_M$ that is an amplified version of the first portion $I_{IMS}$ of the RF signal $I_{RFI}$. The peaking amplifier 22 outputs a peak current $J \cdot I_P$ that is an amplified and phase shifted version of the second portion $I_{IPS}$. The main current $I_M$ and the peak current $J \cdot I_P$ add to become a load current $I_{ZL}$. In exemplary embodiments, the input coupler 32 may be a quadrature coupler such as a branchline coupler or a Lange coupler. Not all embodiments of this disclosure employ the input coupler 32.

In this regard, FIG. 2 is a model of the Doherty amplifier 10 that is indifferent with respect to the input coupler 32. The first impedance inverter 28 and the second impedance inverter 30 inherently include reactance such as inductance, and thus the first impedance inverter coefficient Ka1 and the second impedance inverter coefficient Ka2 are both functions of frequency. If the model of the Doherty amplifier 10 depicted in FIG. 2 is analyzed as a traditional Doherty amplifier that does not include the second impedance inverter 30, the following equation EQ. 1 is determined:

$$I_P(t) = \frac{(I_M(t) - I_{M0}) \cdot Ka1}{j \cdot Z_L} \qquad \text{EQ. 1}$$

where $I_{M0}$ is $I_M$ when $I_P=0$.

In light of EQ. 1, it is apparent that operation of a Doherty amplifier without the second impedance inverter 30 results in $I_P(t)$ being undesirably responsive to Ka1 being a function of frequency. As such, operation of a traditional Doherty amplifier at a 400 MHz modulation bandwidth needed for Fifth-generation New Radio (5G-NR) applications is problematic, if not impossible.

In this regard, to solve this problem, the present disclosure provides the second impedance inverter 30 with Ka2 being ideally set numerically equal to Ka1. A reanalysis of the model of the Doherty amplifier 10 as depicted in FIG. 2 reveals a second equation (EQ. 2) in which $V_{RL}(t)$ and inherently $I_P(t)$ are not responsive to Ka1 and Ka2 as a function of frequency.

$$V_{RL}(t) = -RL \cdot I_M(t) \qquad \text{EQ. 2}$$

In light of EQ. 2, it becomes apparent that $V_{RL}(t)$ and inherently $I_P(t)$ are not responsive to Ka1 and Ka2 as a function of frequency because neither Ka1 nor Ka2 appears in EQ. 2. During the reanalysis it will be apparent that when Ka1 and Ka2 are equal, they ultimately algebraically cancel to yield EQ. 2. In at least one embodiment, a numerical value for Ka1 and Ka2 is established by a third equation (EQ. 3).

$$Ka1 = Ka2 = j \cdot 2 \cdot Z_L \qquad \text{EQ. 3}$$

FIG. 3 is a schematic depicting a first embodiment of a Doherty amplifier system 34 that includes a controller 36 that is configured to control the Doherty amplifier 10. The controller 36 includes a first signal input 38 for receiving an estimate of a magnitude of the load RL. An RL estimate signal may be an analog or a digital signal. The source of the RL estimate signal may come from a baseband processor (not shown), or a voltage standing wave ratio meter (not shown), or an impedance tuner (not shown). In some applications, the load RL is known to be linear and in those cases the first signal input 38 for receiving an estimate of a magnitude of the load RL is not necessary.

The controller 36 also includes a second signal input 40 for receiving a main sense signal derived from the main current $I_M$ by way of a current mirror arrangement that includes a first sense transistor $M_{SENSE1}$ that is coupled between the main output 18 and the second signal input 40 by a drain and a source. A gate of the first sense transistor $M_{SENSE1}$ is coupled to a first mirror output 42 that drives the first sense transistor $M_{SENSE1}$ to mirror a fraction of the main current $I_M$ into the second signal input 40. In this particular exemplary embodiment, the mirrored fraction of the main current $I_M$ is equal to $I_M/100$. Other mirroring fractions are usable with the present disclosure.

In this particular exemplary embodiment, the controller 36 further includes a third signal input 44 that in this case is coupled to the RF signal output 20 to receive a signal representing the load voltage $V_{RL}$ produced by the load current $I_{ZL}$ flowing through the load RL. The controller further includes a first control output 46 that is coupled to a current gain control input 48 of the peaking amplifier 22. The controller 36 is configured to monitor both the mirrored fraction of current from the main current $I_M$ arriving at the second signal input 40 and the signal representing the load voltage $V_{RL}$ at the third signal input 44. The controller 36 is further configured to respond to the mirrored fraction of the main current $I_M$ and the load voltage $V_{RL}$ by controlling the current gain of the peaking amplifier 22 by way of the first control output 46 to govern the peak current $I_P$ such that the load voltage $V_{RL}$ is proportional to the main current $I_M$ while the peaking amplifier 22 is active. In some exemplary applications, the controller 36 is further configured to monitor the RL estimate signal arriving on the first signal input 38 to provide additional control of the current gain of the peaking amplifier to ensure that the load voltage $V_{RL}$ is proportional to the main current $I_M$ while the peaking amplifier 22 is active.

Figure 4:
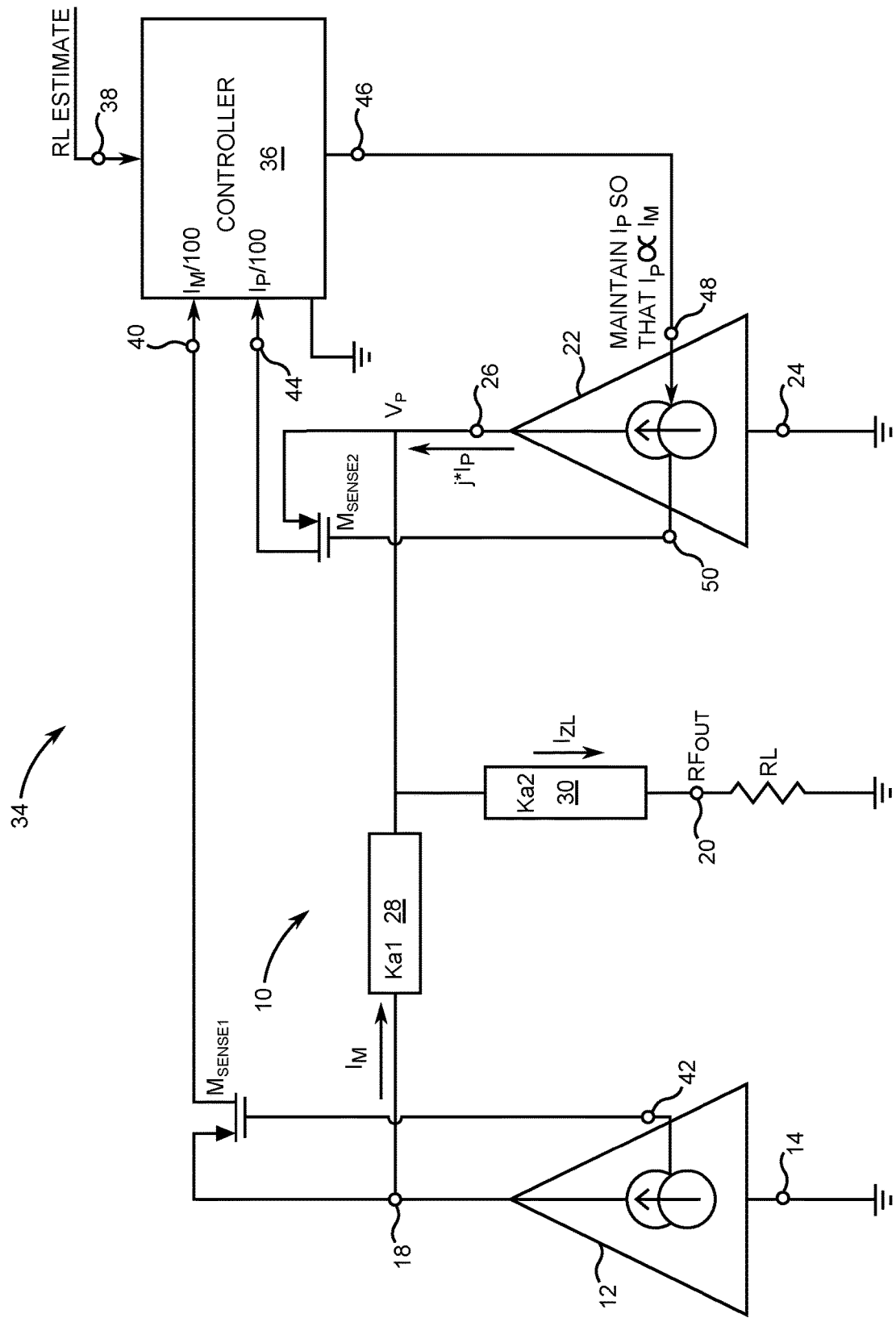
FIG. 4 is a schematic depicting a second embodiment of the Doherty amplifier system.

FIG. 4 is a schematic depicting a second embodiment of the Doherty amplifier system 34. In this particular exemplary embodiment, instead of monitoring the load voltage $V_{RL}$, the controller 36 is configured to monitor a mirrored fraction of the peak current $I_P$. In this case the third signal input 44 is configured for receiving a peak sense signal derived from the peak current $I_P$ by way of a current mirror arrangement that includes a second sense transistor $M_{SENSE2}$ that is coupled between the peak output 26 and the third signal input 44 by a drain and a source. A gate of the second sense transistor $M_{SENSE2}$ is coupled to a second mirror output 50 that drives the second sense transistor $M_{SENSE2}$ to mirror a fraction of the peak current $I_p$ into the third signal input 44. In this particular exemplary embodiment, the mirrored fraction of the peak current $I_p$ is equal to $I_p/100$. Other mirroring fractions are usable with the present disclosure.

In this second exemplary embodiment, the controller 36 is configured to monitor both the mirrored fraction of current the main current $I_M$ arriving at the second signal input 40 and the mirrored fraction of current the peak current $I_p$ arriving at the third signal input 44. The controller 36 is further configured to respond to the mirrored fraction of the main current $I_M$ and the mirrored fraction of the peak current $I_p$ by controlling the current gain of the peaking amplifier 22 by way of the first control output 46 to govern the peak current $I_P$ such that the peak current $I_P$ is proportional to the main current $I_M$ while the peaking amplifier 22 is active. In some exemplary applications, the controller 36 is further configured to monitor the RL estimate signal arriving on the first signal input 38 to provide additional control of the current gain of the peaking amplifier to ensure that the peak current $I_P$ is proportional to the main current $I_M$ while the peaking amplifier 22 is active.

Figure 5:
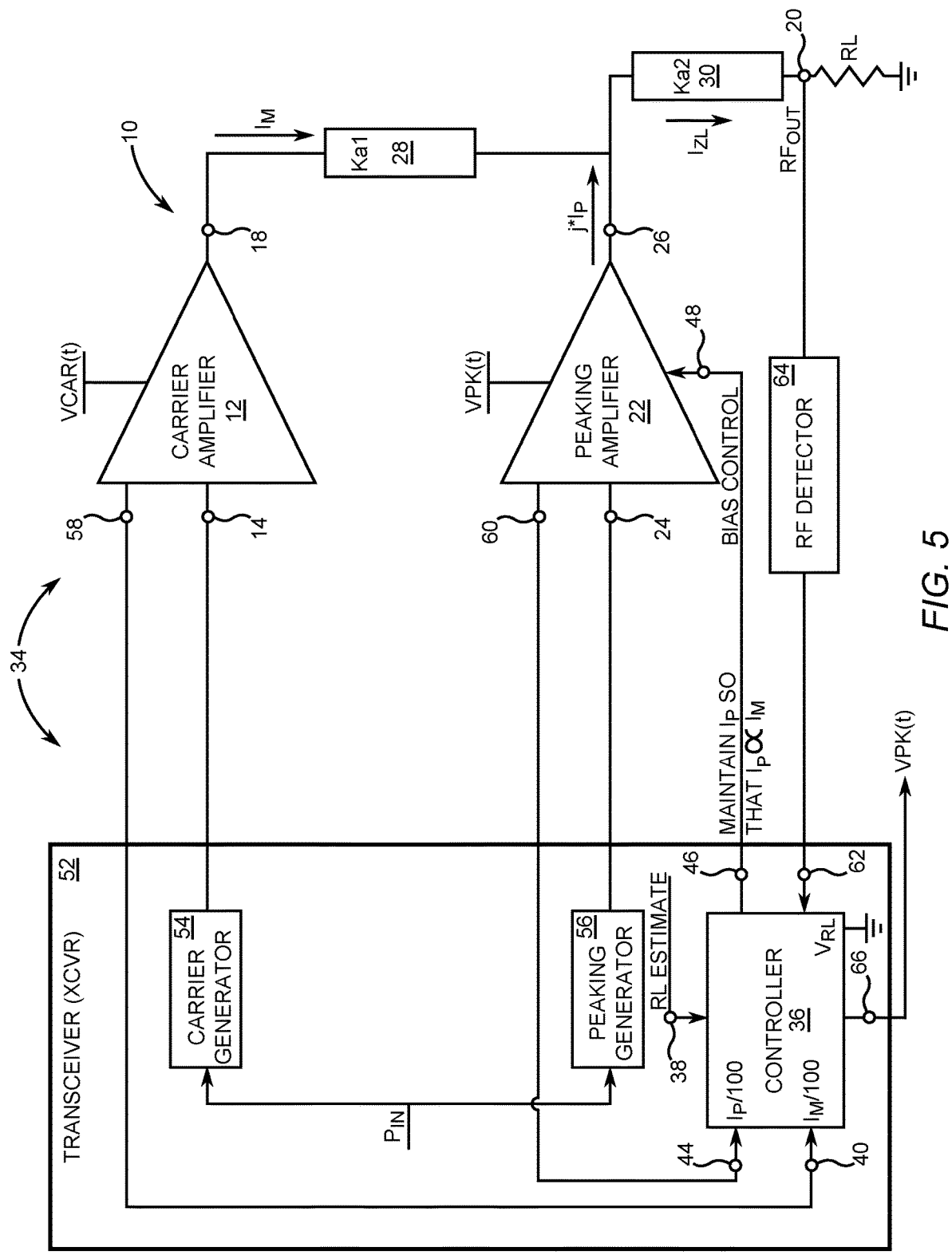
FIG. 5 is a schematic depicting a third embodiment of the Doherty amplifier system.

FIG. 5 is a schematic depicting a third embodiment of the Doherty amplifier system 34. In this third embodiment, the controller 36 is integrated with a transceiver (XCVR) 52. The XCVR 52 also includes a carrier generator 54 that is configured to generate a first portion of an RF signal that drives the main input 14 of the carrier amplifier 12. The carrier generator 54 is also configured to receive a desired power level setting Pin for the RF signal and adjust the first portion of the RF signal accordingly. The XCVR 52 further includes a peaking generator 56 that is configured to generate a second portion of an RF signal that drives the peak input 24 of the peaking amplifier 22. The peaking generator 56 is also configured to receive the desired power level setting Pin for the RF signal and adjust the second portion of the RF signal accordingly.

In this third embodiment, a main current mirror (not shown) is integrated with the carrier amplifier 12. A main current mirror output 58 of the carrier amplifier 12 is coupled to the first signal input 40 of the controller 36. A mirrored fraction of the main current $I_M$ is provided from the carrier amplifier 12 to the controller 36 through the main current mirror output 58. In this case, the mirrored fraction of the main current $I_M$ is $I_M/100$. A peak current mirror output 60 of the peaking amplifier 12 is coupled to the second signal input 44 of the controller 36. A mirrored fraction of the peak current $I_P$ is provided from the peaking amplifier 22 to the controller 36 through the peak current mirror output 60. In this case, the mirrored fraction of the peak current $I_P$ is $I_P/100$.

Moreover, in this third embodiment, the controller 36 further includes a fourth signal input 62 that is coupled to the RF signal output 20 through an RF detector 64. The RF detector provides the controller 36 with a detected copy of load voltage $V_{RL}$. The controller 36 further includes a second control output 66 and is further configured to adjust the peak current flowing from the peaking amplifier 22 by controlling supply modulation of a peaking supply voltage VPK(t) that powers the peaking amplifier 22 by way of the second control out 66. A carrier supply voltage VCAR(t) powers the carrier amplifier 12. Supply modulations for the carrier amplifier 12 and the peaking amplifier 22 may be envelope tracking and/or average power tracking and combinations thereof.

Figure 6:
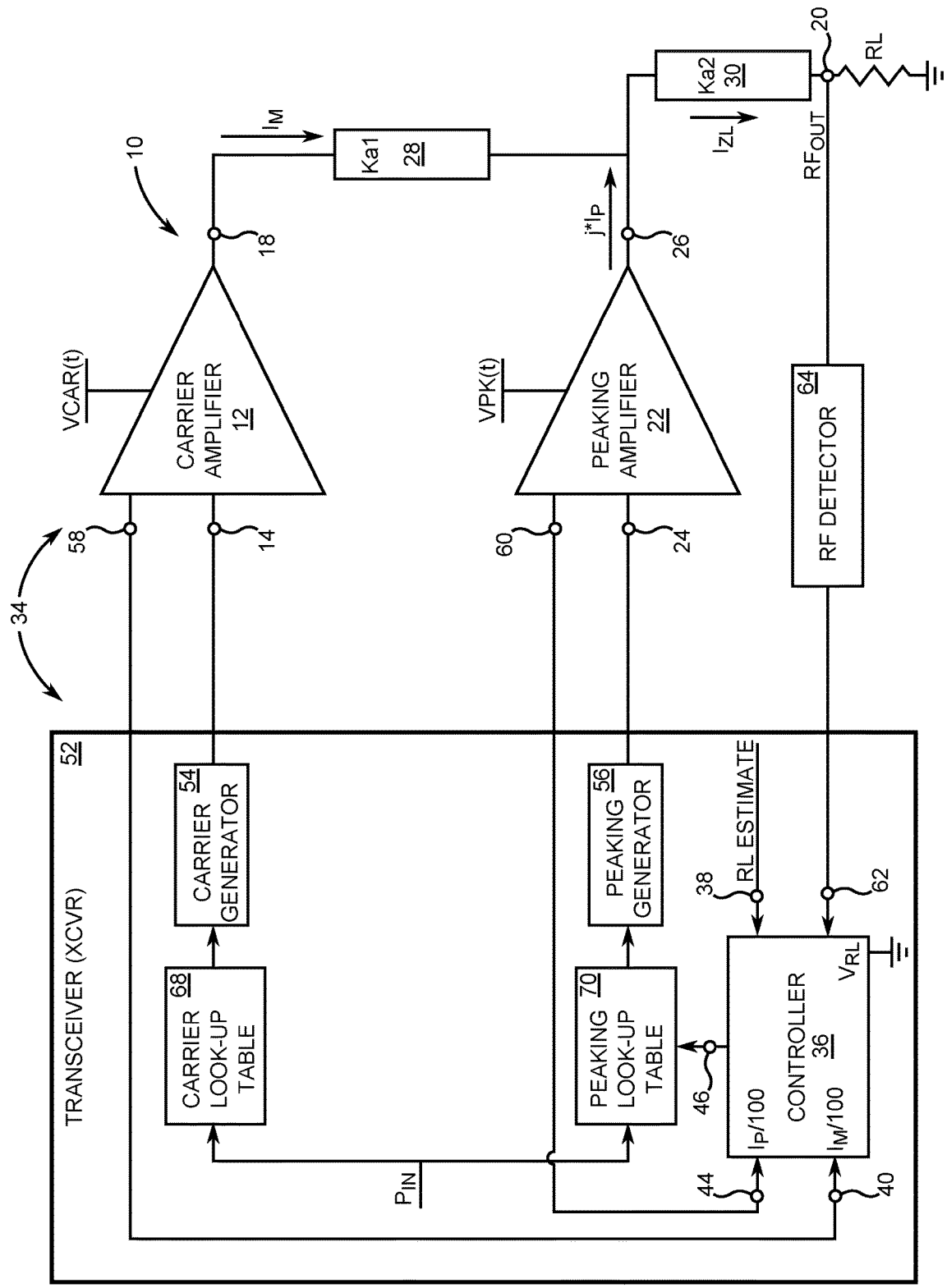
FIG. 6 is a schematic depicting a fourth embodiment of the Doherty amplifier system.

FIG. 6 is a schematic depicting a fourth embodiment of the Doherty amplifier system 34. In this fourth exemplary embodiment, the XCVR 52 also includes a carrier lookup table 68 that in conjunction with the carrier generator 54 is configured to provide digital pre-distortion to the first portion of the RF signal generated by the carrier generator 54. The XCVR 52 further includes a peaking lookup table 70 that in conjunction with the peaking generator 56 is configured to provide digital pre-distortion to the second portion of the RF signal generated by the peaking generator 56.

In this fourth exemplary embodiment, the peaking lookup table 70 is also in communication with the controller 36 by way of the first control output 46 of the controller 36, which is further configured to control the output of the peaking lookup table 70 in response to a combination of the signals received by the controller 36. The input signals may include the mirrored fraction of the main current I$_m$, the mirrored fraction of the peak current I$_p$, the load voltage V$_{RL}$, and the RL estimate signal. The controller 36 is configured to ensure that the peak current I$_P$ is in proportion to the main current I$_M$ by controlling the output of the peaking lookup table 70. Thus, this fourth embodiment does not rely on control of the bias of the peaking amplifier 22 that can be overly sensitive in some applications.

Figure 7:
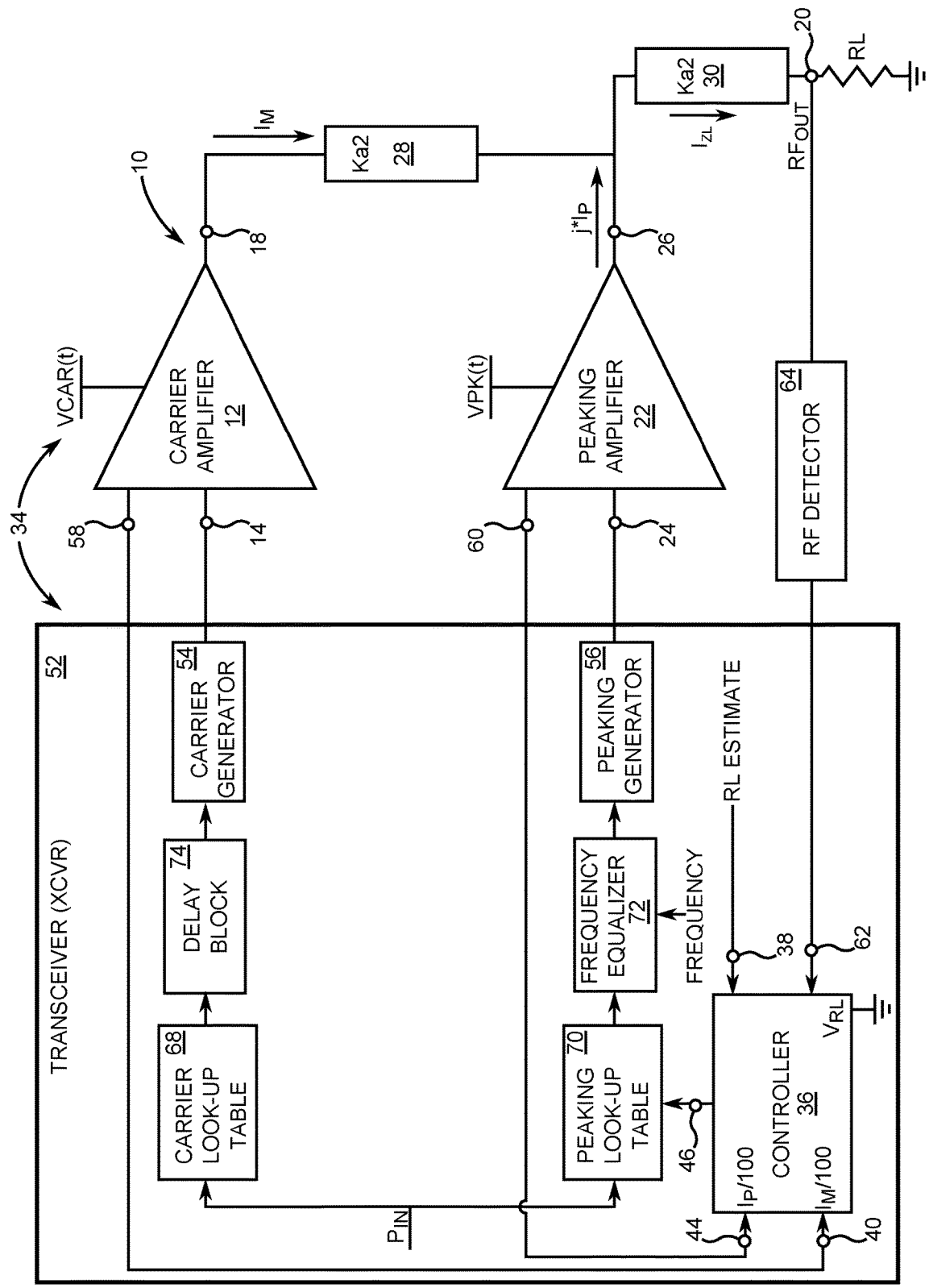
FIG. 7 is a schematic depicting a fifth embodiment of the Doherty amplifier system.

FIG. 7 is a schematic depicting a fifth exemplary embodiment of the Doherty amplifier system 34. In this fifth exemplary embodiment, the XCVR 52 further includes a frequency equalizer 72 that adjusts values output from the peaking lookup table 70 such that the second portion of the RF signal generated by the peaking generator 56 is adjusted for changes in frequency of the RF signal during a transition from one frequency of operation to another. The frequency equalizer 72 requires time to adjust the values output from the peaking lookup table 70; therefore, a delay block 74 is added inline between the carrier lookup table 68 and the carrier generator 54 to provide a time delay to within ±5% of the time the frequency equalizer 72 needs to adjust the peaking lookup values. In other words, the delay block 74 is in communication with the carrier lookup table 68 and the carrier generator 54, and the delay block 74 is configured to provide a delay that is within ±5% of the time consumed by the frequency equalizer 72 during operation of the peaking generator 56. A baseband processor (not shown) typically provides the frequency information to the frequency equalizer 72. The operation of the controller 36 in this fifth exemplary embodiment is identical to the operation of the controller 36 as described for the fourth embodiment of FIG. 6.

Those skilled in the art will recognize improvements and modifications to the preferred embodiments of the present disclosure. All such improvements and modifications are considered within the scope of the concepts disclosed herein and the claims that follow.

What is claimed is:

1. A Doherty amplifier system comprising:
a carrier amplifier having a main input for receiving a first portion of a radio frequency (RF) signal and a main output in communication with a RF signal output;
a peaking amplifier having a peak input for receiving a second portion of the RF signal and a peak output in communication with the RF signal output;
a first impedance inverter coupled between the main output and the peak output;
a second impedance inverter coupled between the peak output and the RF signal output, wherein a first impedance inverter coefficient of the first impedance inverter is numerically within ±10% of a second impedance inverter of the second impedance inverter; and
a controller in communication with the peaking amplifier, the controller having a first signal input, a second signal input, and a first control output, wherein the controller is configured to maintain a peak current flowing from the peak output in proportion with a main current flowing from the main output when the peaking amplifier is active by providing through the first control output a control signal that adjusts the peak current of the peaking amplifier based upon at least a first signal received at the first signal input and a second signal received at the second signal input.

2. The Doherty amplifier system of claim 1, wherein the first impedance inverter coefficient is numerically within ±5% of the second impedance inverter coefficient.

3. The Doherty amplifier system of claim 1, wherein the first impedance inverter coefficient is numerically within ±1% of the second impedance inverter coefficient.

4. The Doherty amplifier system of claim 1, wherein the first control output is coupled to a gain control input of the peaking amplifier.

5. The Doherty amplifier system of claim 1, wherein the first signal is a mirrored fraction of the main current.

6. The Doherty amplifier system of claim 5, wherein the second signal is proportional to a load voltage across a load coupled to the RF signal output.

7. The Doherty amplifier system of claim 1, wherein second signal is a mirrored fraction of the peak current flowing from the peak output.

8. The Doherty amplifier system of claim 1, wherein the controller further includes a third signal input configured to receive a third signal that is an estimate of load impedance coupled to the RF signal output.

9. The Doherty amplifier system of claim 1, wherein the controller is further configured to control the peak current such that an RF voltage across a load coupled to the RF signal output is equal to an impedance of the load multiplied by a negative of the main current.

10. The Doherty amplifier system of claim 9, further including an RF detector coupled between the RF signal output and the second signal input.

11. The Doherty amplifier system of claim 1, wherein the controller is further configured to adjust the peak current flowing from the peaking amplifier by controlling supply modulation of a supply voltage that powers the peaking amplifier.

12. The Doherty amplifier system of claim 11, wherein the supply modulation is envelope tracking.

13. The Doherty amplifier system of claim 12, wherein the supply modulation is average power tracking.

14. The Doherty amplifier system of claim 1, further including a transceiver wherein the controller is integrated within the transceiver.

15. The Doherty amplifier system of claim 14, wherein the transceiver further comprises:
a carrier generator configured to generate the first portion of the RF signal that drives the main input of the carrier amplifier; and
a peaking generator configured to generate the second portion of the RF signal that drives the peak input of the peaking amplifier.

16. The Doherty amplifier system of claim 15, wherein the transceiver further comprises:

a carrier lookup table that is configured in conjunction with the carrier generator to provide digital pre-distortion to the first portion of the RF signal generated by the carrier generator; and a peaking lookup table that is configured in conjunction with the peaking generator to provide digital pre-distortion to the second portion of the RF signal generated by the peaking generator.

17. The Doherty amplifier system of claim 16, wherein the peaking lookup table is in communication with the controller by way of the first control output of the controller that is further configured to adjust values sent from the peaking lookup table to the peaking generator in response to at least the first signal and the second signal received by the controller through at least the first signal input and the second signal input.

18. The Doherty amplifier system of claim 16, wherein the transceiver further includes a frequency equalizer that adjusts values output from the peaking lookup table so that the second portion of the RF signal generated by the peaking generator is adjusted for changes in frequency of the RF signal during a transition from one frequency of operation to another.

19. The Doherty amplifier system of claim 18, wherein the transceiver further includes a delay block in communication with the carrier lookup table and the carrier generator, wherein the delay block is configured to provide a delay that that is within ±5% of time consumed by the frequency equalizer during operation of the peaking generator.

* * * * *

UNITED STATES PATENT AND TRADEMARK OFFICE
CERTIFICATE OF CORRECTION

PATENT NO. : 11,108,360 B2
APPLICATION NO. : 16/516766
DATED : August 31, 2021
INVENTOR(S) : Nadim Khlat It is certified that error appears in the above-identified patent and that said Letters Patent is hereby corrected as shown below:

In the Claims

Claim 1, Column 8, Lines 1-2, replace "is numerically within ±10% of a second impedance inverter of the second impedance inverter" with --is numerically within ±10% of a second impedance inverter coefficient of the second impedance inverter--.

Signed and Sealed this
Twenty-sixth Day of October, 2021

Drew Hirshfeld
*Performing the Functions and Duties of the
Under Secretary of Commerce for Intellectual Property and
Director of the United States Patent and Trademark Office*